(12) United States Patent
Lee et al.

(10) Patent No.: US 10,104,763 B2
(45) Date of Patent: Oct. 16, 2018

(54) ELECTRONIC CIRCUIT BOARD ASSEMBLY INCLUDING EMI SHIELDING STRUCTURE AND THERMAL PAD

(71) Applicant: 3M INNOVATIVE PROPERTIES COMPANY, St. Paul, MN (US)

(72) Inventors: Mihee Lee, Gyunggu-Do (KR); Jung-Ju Suh, Seoul (KR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 15/328,535

(22) PCT Filed: Oct. 7, 2015

(86) PCT No.: PCT/US2015/054361
§ 371 (c)(1),
(2) Date: Jan. 24, 2017

(87) PCT Pub. No.: WO2016/060901
PCT Pub. Date: Apr. 21, 2016

(65) Prior Publication Data
US 2017/0251549 A1    Aug. 31, 2017

(30) Foreign Application Priority Data

Oct. 17, 2014    (KR) .................. 10-2014-0140703

(51) Int. Cl.
*H05K 7/20* (2006.01)
*H05K 1/02* (2006.01)
(Continued)

(52) U.S. Cl.
CPC .......... *H05K 1/0216* (2013.01); *G06F 1/203* (2013.01); *H05K 1/0203* (2013.01); *H05K 1/181* (2013.01);
(Continued)

(58) Field of Classification Search
CPC . G06F 1/181–1/182; H05K 7/20218–7/20381;
(Continued)

(56) References Cited

U.S. PATENT DOCUMENTS 8,289,713 B2    10/2012    Miyashita et al.
8,379,390 B2    2/2013    Inoue
(Continued)

FOREIGN PATENT DOCUMENTS

JP    2004-006973    1/2004
JP    2005-064266    3/2005
(Continued)

OTHER PUBLICATIONS

PCT International Search Report from PCT/US2015/054361; dated Feb. 2, 2016, 3 pages.

*Primary Examiner* — Anthony Haughton
*Assistant Examiner* — Razmeen Gafur
(74) *Attorney, Agent, or Firm* — Jonathan L. Tolstedt

(57) ABSTRACT

Provided is an electronic circuit board assembly. The electronic circuit board assembly includes an electronic circuit board, a plurality of electronic circuit devices disposed on the electronic circuit board, an electromagnetic interference (EMI) shielding structure configured to shield an electromagnetic wave generated from the plurality of electronic circuit devices, and a thermal pad configured to dissipate heat generated from the plurality of electronic circuit devices. The EMI shielding structure covers the plurality of electronic circuit devices and is attached to the electronic circuit board, and the thermal pad is disposed between the plurality of electronic circuit devices and the EMI shielding structure, contacts the plurality of electronic circuit devices and the EMI shielding structure, and thereby can transfers the heat generated from the plurality of electronic circuit devices to the EMI shielding structure.

7 Claims, 2 Drawing Sheets

(51) Int. Cl.
  *H05K 1/18* (2006.01)
  *H05K 9/00* (2006.01)
  *G06F 1/20* (2006.01)
  *H01L 23/473* (2006.01)
  *H04M 1/02* (2006.01)

(52) U.S. Cl.
  CPC ......... *H05K 9/0032* (2013.01); *H04M 1/0277* (2013.01); *H05K 2201/10371* (2013.01); *H05K 2201/10522* (2013.01)

(58) Field of Classification Search
  CPC ............... H05K 7/20409–7/20418; H05K 7/20009–7/202; H01L 23/367–23/3677; H01L 23/473; H01L 23/46–23/467
  USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
  See application file for complete search history.

(56) References Cited

U.S. PATENT DOCUMENTS

| | | | | |
|---|---|---|---|---|
| 2001/0026440 A1* | 10/2001 | Mellberg | ............ | H05K 7/1431 361/704 |
| 2003/0161108 A1* | 8/2003 | Bright | ................. | G02B 6/4201 361/707 |
| 2003/0184976 A1* | 10/2003 | Brandenburg | ......... | H05K 5/065 361/719 |
| 2004/0029311 A1* | 2/2004 | Snyder | ................ | H01M 2/0275 438/106 |
| 2004/0252462 A1* | 12/2004 | Cromwell | ........... | H01L 23/4093 361/719 |
| 2005/0185380 A1* | 8/2005 | Lee | ....................... | G06F 1/1616 361/704 |
| 2005/0270745 A1* | 12/2005 | Chen | ................... | H01F 27/2804 361/707 |
| 2006/0126309 A1* | 6/2006 | Bolle | ................. | H05K 7/20436 361/719 |
| 2006/0203453 A1* | 9/2006 | Chen | ..................... | H01L 23/552 361/704 |
| 2007/0035929 A1* | 2/2007 | Hsu | ..................... | H01L 23/3675 361/704 |
| 2007/0086170 A1* | 4/2007 | Liang | .................... | H01L 23/367 361/719 |
| 2007/0165376 A1* | 7/2007 | Bones | ................... | H01L 25/162 361/688 |
| 2007/0211436 A1* | 9/2007 | Robinson | .............. | H01L 23/552 361/719 |
| 2008/0002367 A1* | 1/2008 | Gilliland | ............... | H01L 23/552 361/709 |
| 2008/0190585 A1* | 8/2008 | Lundell | ................... | F28F 13/00 165/46 |
| 2010/0142153 A1* | 6/2010 | Ho | ...................... | H01L 23/3677 361/710 |
| 2010/0157544 A1* | 6/2010 | Tsao | ................... | H05K 7/20454 361/720 |
| 2011/0255247 A1* | 10/2011 | Chu | .................... | H01L 23/4093 361/709 |
| 2013/0141866 A1* | 6/2013 | Refai-Ahmed | ..... | H01L 23/3672 361/679.54 |
| 2013/0235528 A1* | 9/2013 | Lee | .................... | H05K 7/20418 361/704 |
| 2014/0153192 A1* | 6/2014 | Neer | .................... | G02B 6/4277 361/704 |
| 2014/0268578 A1* | 9/2014 | Dolci | ................... | H05K 9/0049 361/719 |
| 2015/0077932 A1* | 3/2015 | Chai | ......................... | G06F 1/20 361/679.54 |
| 2015/0282387 A1* | 10/2015 | Yoo | .................... | H05K 7/20336 361/700 |
| 2015/0382448 A1* | 12/2015 | Pennathur | ........... | H05K 1/0203 361/679.54 |

FOREIGN PATENT DOCUMENTS

| | | |
|---|---|---|
| KR | 2009-0030939 | 3/2009 |
| KR | 2010-0096589 | 9/2010 |
| KR | 10-1136189 | 4/2012 |
| KR | 10-1422249 | 8/2014 |
| WO | 2004/071144 | 8/2004 |

\* cited by examiner

ELECTRONIC CIRCUIT BOARD ASSEMBLY INCLUDING EMI SHIELDING STRUCTURE AND THERMAL PAD

TECHNICAL FIELD

The present invention relates to an electronic circuit board assembly including an electromagnetic interference (EMI) shielding structure and a thermal pad, and more particularly, to an electronic circuit board assembly manufactured in a very thin type using an EMI shielding tape and a highly soft thermal pad, and a portable electronic device including the same.

BACKGROUND

With a development of telecommunication industry and an establishment of an information society, modern consumers demand electronic devices which have a number of functions and excellent data processing capabilities which are easily available at any place. Electronic device manufacturers are competitively releasing the electronic devices which are compact and have the excellent data processing capabilities to meet the needs of these consumers.

For example, in an electronic device which is commonly referred to as "a smart phone," all auxiliary devices such as a GPS receiver, a camera, and a local area network connecting device as well as a basic function of a mobile phone are being integrated by applying a high-performance data processor, a memory, a high-resolution display, and an image processing chip. Further, the smart phone may provide various functions such as full Internet connectivity, entertainment including a full-resolution video, a navigator, Internet banking, and the like in a pocket-sized device. Therefore, in a portable electronic device such as the smart phone, demands for packaging a number of electronic circuit devices in a small space and physically disposing the electronic circuit devices in more compact arrangement, are becoming more and more intense along with a rapid development of the portable electronic devices.

In the miniaturized electronic device, a number of circuits should be integrated in a small space, and thus there is a disadvantage that these are easily subject to influence from an electric wave noise. Further, an EMI is generated in the electronic device due to an electromagnetic wave that is generated from the electronic device itself, or that ingresses the electronic device from the outside, or that flows through a connected circuit line. In order to reduce harmful effects caused by the electromagnetic wave, conventionally, a method of installing an EMI shielding structure of a conductive material to block the electromagnetic wave and covering a predetermined region of the electronic circuit board, has been used.

Meanwhile, the electronic device inevitably generates heat due to a characteristic of a material itself and an electrical resistance occurring on a connection part of respective components during the operation of the device. As the generated heat increases a temperature of the operating component, the generated heat is the cause of reduced service life of the electronic device, and specifically, it tends to cause a malfunction to occur above a specific temperature, or to make it difficult for the influenced component to demonstrate maximum performance. In addition, considering that a miniaturization and an integration of the electronic device lead to an increasing number of circuits included in a unit area and to more serious heat generation issue, the heat generation of the miniaturized electronic device has emerged as a serious concern. An active cooling method of using a cooling fan as a method of cooling shows the highest cooling performance, but with problem such as noise generated from the cooling fan and power consumption necessary for the operation of a cooling device. Additionally, since additional electronic circuits and component spaces are required, there is a disadvantage that a miniaturization of the product, which is a recent trend of the electronic device, is becoming difficult. Therefore, a passive cooling method which emits the heat to the outside using a thermal pad, etc. is mainly used. Since the passive cooling method causes heat to dissipate to outside simply through the thermal pad, etc., power is not necessarily required for operating the device, noise does not occur, and a greater degree of freedom can be granted in terms of the design of the electronic device, compared to the method of using the cooling fan.

It is important that the thermal pad which uses heat transfer by conduction is in close contact with the electronic circuit. However, when a space is generated between the electronic circuit and the thermal pad, the heat transfer efficiency deteriorates in the space, and temperature is partially increased, thus leading into both malfunctions of the electronic circuit and a reduction in durability. Therefore, it is necessary that the thermal pad uses a material capable of ensuring adhesion with the electronic device.

Further, since the malfunctions and reduced durability of the device, and a risk of accident as well as a waste of the power can be caused when a leakage current occurs on a thermal plate or an outer surface of a product, which is made of metal material, the thermal pad should have a high electrical insulation characteristic in addition to an excellent cooling effect. Therefore, a development of a new thermal pad, with improved thermal conductivity and the electrical insulation characteristic than the conventional thermal pad, and specifically, applicability to a miniaturized electronic device, is necessary.

SUMMARY

Technical Problem

The present invention is directed to providing an electronic circuit board assembly which includes an electromagnetic interference (EMI) shielding structure and a thermal pad, but can be fabricated into a very thin type.

Technical Solution

One aspect of the present invention provides an electronic circuit board assembly including: an electronic circuit board; a plurality of electronic circuit devices disposed on the electronic circuit board; an electromagnetic interference (EMI) shielding structure configured to shield an electromagnetic wave generated from the plurality of electronic circuit devices; and a thermal pad configured to dissipate heat generated from the plurality of electronic circuit devices. The EMI shielding structure may cover the plurality of electronic circuit devices and may also be attached to the electronic circuit board, and the thermal pad may be disposed between the plurality of electronic circuit devices and the EMI shielding structure, may contact the plurality of electronic circuit devices and the EMI shielding structure, and thereby transfer the heat generated from the plurality of electronic circuit devices to the EMI shielding structure.

At least one of the plurality of electronic circuit devices may have a height different from other electronic circuit devices, the EMI shielding structure may be divided into at least one EMI shielding region, and the thermal pad disposed on each EMI shielding region may include a single sheet and may be compressed to fill spaces between the EMI shielding structure and the plurality of electronic circuit devices.

It is preferable that a compression set of the thermal pad is 70% or more.

The EMI shielding structure may be an EMI shielding tape.

The thermal pad may include a polymer matrix and a filler, the polymer matrix may include at least one of a silicone elastomer and an acrylic polymer, and the filler may include at least one of aluminum oxide, aluminum hydroxide, aluminum nitride, and boron nitride.

An electronic device including an electronic circuit board assembly according to the present invention may be a smart phone, a smart pad, or a portable computer.

Advantageous Effects

According to the present invention, an electromagnetic interference (EMI) shielding structure and a thermal pad may be mounted on an electronic circuit board at low cost and with convenience. Further, since an EMI shielding tape and a single sheet of thermal pad are used, anelectronic circuit board assembly can be manufactured in a very thin type.

DETAILED DESCRIPTION

Hereinafter, exemplary embodiments of the invention will be described in detail with reference to the accompanying drawings. The following embodiments should be considered in a descriptive sense only in order to understand that the spirit and scope of the invention is not limited to the exemplary embodiments.

Figure 1:
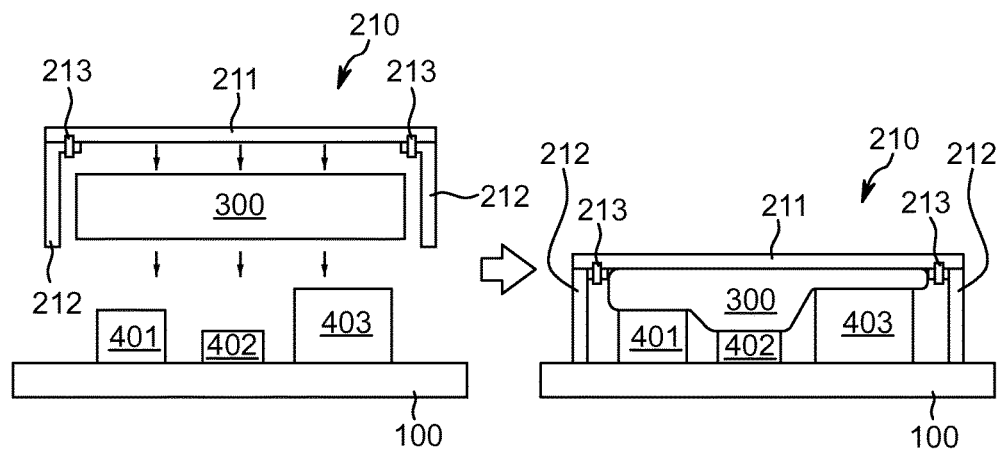
FIG. 1 is a view showing an electronic circuit board assembly in which a shielding can and a thermal pad are applied according to a first exemplary embodiment of the present invention.

FIG. 1 is a view showing a configuration, in which a thermal pad 300 and a shielding can 210 are mounted on an electronic circuit board 100 on which a plurality of electronic circuit devices 401, 402, and 403 are disposed, according to a first exemplary embodiment of the present invention. In an electronic device, for example, a mobile device, etc., a conventional technique in which a metal shielding can is installed on an electronic circuit board in order to block EMI and protect circuit devices is known. The shielding can 210 includes an upper plate 211, pillars 212, and coupling parts 213. The shielding can 210 is divided into regions to separate various function parts from each other and forms edges, and then the edges are coupled to the electronic circuit board.

In a miniaturized mobile device, a thickness and a width of the circuit device are reduced, and thus the metal shielding can may contact devices densely integrated therein. Since an electrical short may occur, or damage or a malfunction due to an induction phenomenon may be caused when the metal shielding can contacts the internal device, it is preferable that a pad having electrical insulation, an insulating tape, or an insulating film, is installed between the shielding can and the circuit device.

When the above-described pad has thermal conductivity, heat generated from the circuit device may be dissipated to the outside through the metal shielding can. Therefore, it is preferable that the thermal pad is manufactured of a material having excellent thermal conductivity while having electrical insulation. Thermal conductivity refers to a phenomenon in which a thermal energy is continuously transferred from a high-temperature part to a low-temperature part without involving movement of the material. Thermal conductivity of a solid may be classified into the thermal conductivity by an electron and the thermal conductivity by lattice vibrations. In the case of a material having free electrons, such as a metal, a thermal energy is mainly transferred by the free electrons. However, in the case of an insulator, as variations of atoms and molecules locally generated by heat have a sort of wave nature, the wave is reflected by a surface, makes a standing wave, and the heat is transferred by an operating principle in which an entire standing wave energy uniformly increases an internal energy. Such a variation is called a lattice vibration. Metal has a high thermal conductivity. However, since the metal has an electrical conductivity due to the free electrons, it is not preferable that the metal is used as a filler material of the thermal pad according to the present invention. A material of the ceramic family has a thermal conductivity lower than the metal. However, since the material of the ceramic family has a relatively good thermal conductivity compared to materials other than the metal and also has an electrical insulation, it is appropriate that the material of the ceramic family is used as a thermal conductive filler of the thermal pad according to the exemplary embodiment of the present invention.

Hereinafter, a method of manufacturing the thermal pad according to the exemplary embodiment of the present invention will be described. The thermal pad according to the exemplary embodiment of the present invention may include a polymer matrix and a ceramic filler; the polymer matrix may include a silicone elastomer and an acrylic polymer, or the like, and the filler may include aluminum oxide, aluminum hydroxide, aluminum nitride, and boron nitride, or the like. Raw materials of the thermal pad are mixed, and then the thermal pad is formed in a sheet form. As the pad formed into a sheet form is processed by thermal curing and UV curing and then is cut to a predetermined size, the thermal pad according to the exemplary embodiment of the present invention may be manufactured.

As shown in FIG. 1, the thermal pad 300 is disposed between the shielding can 210 and the electronic circuit devices 401, 402, and 403. Since the plurality of circuit devices 401, 402, and 403 have different heights, intervals between the shielding can and the electronic circuit devices are not uniform. When a plurality of thermal pads having different thicknesses are used to fill spaces between the different-sized intervals, the number of processes is increased, and thus the manufacturing cost of the assembly is increased. Meanwhile, when the pad with a single sheet is used, problems in that the shielding can is modified or a connection part between the shielding can and the circuit board is easily separated may occur due to elasticity of the pad, i.e., restoring force of the pad. Since the thermal pad manufactured according to the exemplary embodiment of the present invention does not substantially have any restoring force, the above-described problems may be prevented. Therefore, it is preferable that the thermal pad according to the exemplary embodiment of the present invention has a compression set of 70% or more, and more preferably, 95% or more.

Figure 4:
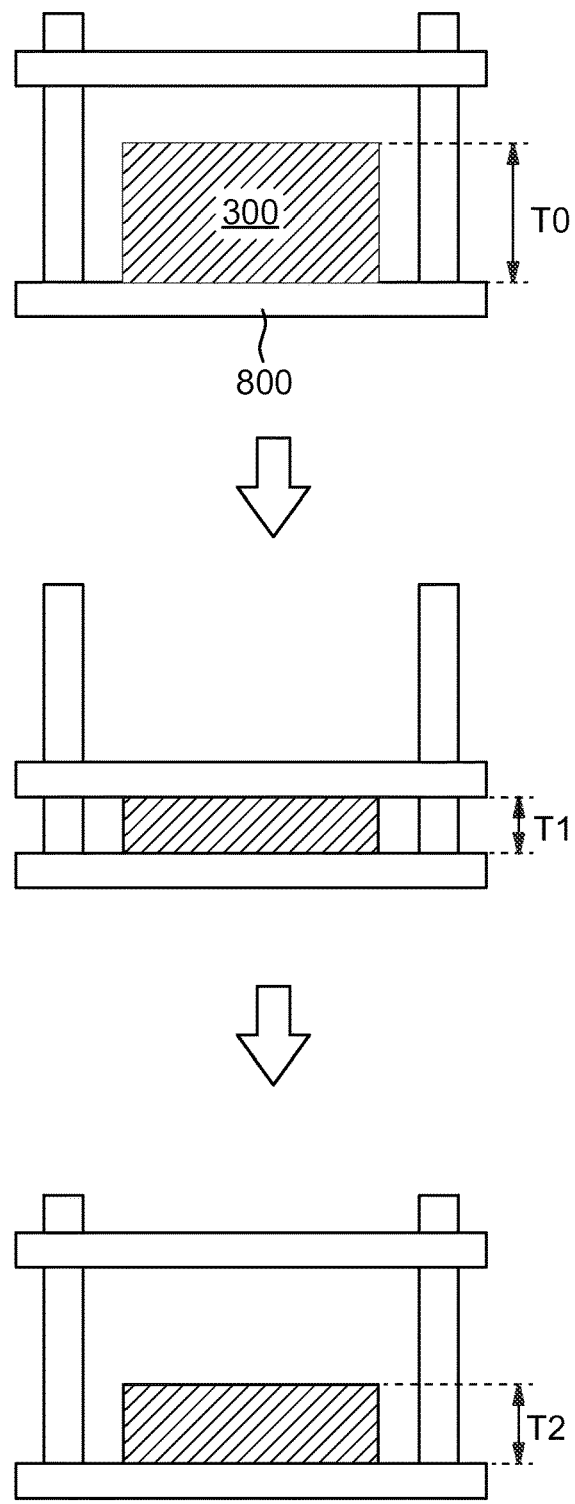
FIG. 4 is a view showing a method of measuring a compression set of the thermal pad according to the exemplary embodiments of the present invention.

As shown in FIG. 4, a compression set of the thermal pad 300 manufactured according to the exemplary embodiment of the present invention was measured according to the American Society for Testing and Materials (ASTM) D395. A specimen having a 20 mm width, a 20 mm height, and a 1.0 mm thickness was installed on a test jig 800, and was allowed to stand for 72 hours in a state in which it was compressed into 0.7 mm. After the test jig 800 was removed, and the specimen was allowed to stand for 30 minutes at a room temperature, and then the thickness of the specimen was measured. The compression set was calculated as the following:

$$\text{compression set } (\%) = \frac{T_0 - T_2}{T_0 - T_2} * 100$$

where $T_0$ is an initial thickness of the specimen, $T_1$ is a thickness of the specimen compressed on a jig, and $T_2$ is a thickness of the specimen restored after 30 minutes after the jig was removed.

The thermal pad manufactured according to the exemplary embodiment of the present invention showed a compression set of approximately 98%. Since the thermal pad according to the exemplary embodiment of the present invention does not substantially have any restoring force, compared to conventional thermal pads, wherein for example, a 3M 5570 pad of the 3M Company shows a compression set of approximately 40%, and a 3M 5516 pad shows a compression set of approximately 50%, the thermal pad does not cause a modification problem or the like of the shielding can due to the restoring force of the pad, etc. That is, even though the thermal pad configured in a single sheet fills different-sized spaces between the shielding can and the plurality of circuit devices, it is unnecessary to use the different-sized pads according to the heights of the circuit devices. Further, since the thermal pad does not substantially have any restoring force, the modification problem of the shielding can does not occur.

Figure 2:
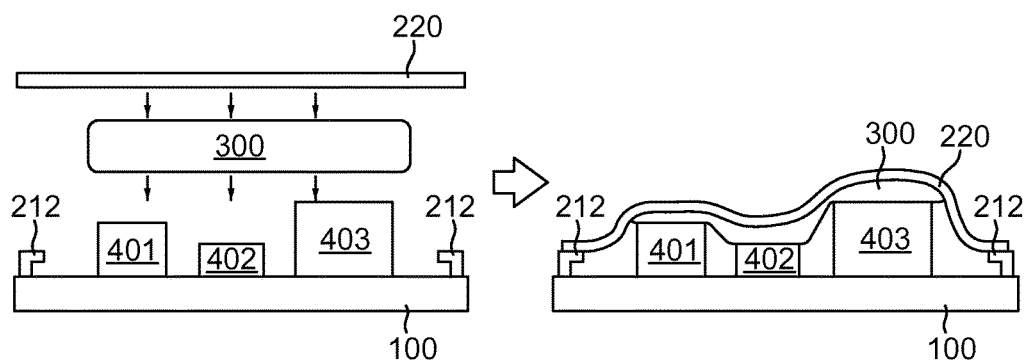
FIG. 2 is a view showing an electronic circuit board assembly in which a shielding tape and a thermal pad are applied according to a second exemplary embodiment of the present invention.
Figure 3:
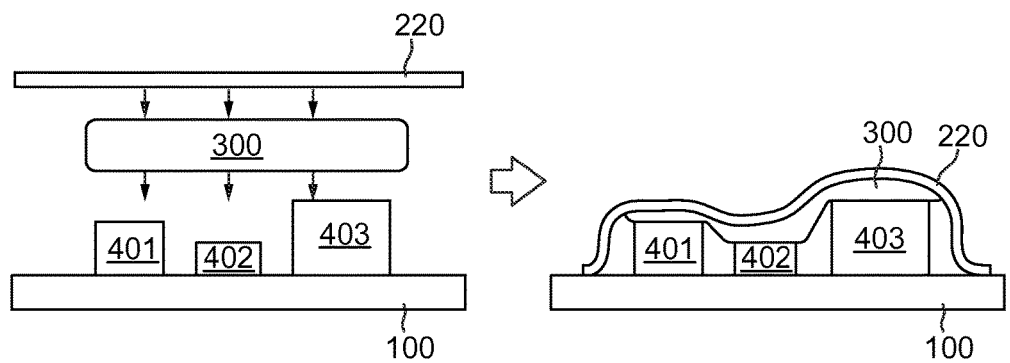
FIG. 3 is a view showing an electronic circuit board assembly in which a shielding tape and a thermal pad are applied according to a third exemplary embodiment of the present invention.

In, FIGS. 2 and 3, each shows an electronic circuit board assembly in which a shielding tape 220 instead of the shielding can 210 is applied. As described in the exemplary embodiment of FIG. 1, since the coupling part 213 is needed to couple to the upper plate 211 to the pillar 212 when the shielding can 210 is used as an EMI shielding, there is a limit to reducing the entire thickness of the electronic circuit board assembly. Further, since a circuit board bonding part is needed when the shielding can is used, various processes are additionally required to fix the shielding can to the circuit board as well as to manufacturing the shielding can. However, since the shielding tape is attached using an adhesive coated on a surface thereof when the shielding tape is used, an additional bonding part is not necessary, and the attaching process may also be simplified. Therefore, when the shielding tape 220 instead of the shielding can 210 is used, the thickness of the electronic circuit board assembly may be reduced significantly more. When the shielding tape 220 is used, the shielding tape 220 may be attached to the pillar 212 after the pillar 212 is installed on the electronic circuit board as shown in FIG. 2, and the shielding tape 220 may also be directly attached to the electronic circuit board as shown in FIG. 3. When the shielding tape 220 is used as shown in FIGS. 2 and 3, spaces of different heights are present between the plurality of circuit devices 401, 402, and 403 and the shielding tape 220. Since a fixation force of the shielding tape 220 is relatively weak compared to that of the shielding can 210 when the EMI shielding structure is configured using the shielding tape 220, the tape is easily detached due to the restoring force of the thermal pad. However, when the thermal pad, in which the restoring force is almost nonexistent, according to the exemplary embodiment of the present invention is used, the problem in that the tape is easily detached does not occur. Further, as the thermal pad 300 is disposed between the circuit device and the tape, heat generated from the circuit device may be dissipated to the outside through the shielding tape.

When the electronic circuit board should be divided into a plurality of EMI shielding regions (not shown), an electronic circuit board assembly, in which an EMI shielding structure and a thermal pad are formed, may be manufactured using only a thermal pad and a shielding tape, which are cut to appropriate sizes. In a conventional EMI shielding structure, a shielding can which is divided into the plurality of EMI shielding regions according to a structure of the circuit board should be manufactured, and a plurality of thermal pads having different thicknesses and sizes should be cut and attached. However, when the shielding tape and the thermal pad according to the exemplary embodiment of the present invention are used, the EMI shielding structure and the thermal pad may be simply applied by only a process of cutting the tape and the pad by the appropriate sizes and a process of sequentially attaching the tape and the pad.

The shielding tape according to the exemplary embodiment of the present invention, by which an acrylic polymer adhesive is coated on a metal sheet of copper or aluminum, and an electrical conductive filler, for example, a filler of nickel, silver, copper, aluminum, or the like is added, may be manufactured. The shielding tape may be manufactured using a method in which a mixture of the adhesive and the filler is coated on the metal sheet.

While the present invention has been particularly described with reference to exemplary embodiments, it will be understood by those of skilled in the art that various changes in form and details may be made without departing from the spirit and scope of the present invention. Therefore, the exemplary embodiments should be considered in a descriptive sense only and not for purposes of limitation. The scope of the invention is defined not by the detailed description of the invention but by the appended claims, and encompasses all modifications and equivalents that fall within the scope of the appended claims.

The invention claimed is:
1. An electronic circuit board assembly, comprising:
an electronic circuit board;
a plurality of electronic circuit devices disposed on the electronic circuit board;
an electromagnetic interference (EMI) shielding structure configured to shield an electromagnetic wave generated from the plurality of electronic circuit devices; and
a thermal pad configured to dissipate heat generated from the plurality of electronic circuit devices, wherein the EMI shielding structure covers the plurality of electronic circuit devices and is also attached to the electronic circuit board, and the thermal pad is disposed between the plurality of electronic circuit devices and the EMI shielding structure, contacts the plurality of electronic circuit devices and the EMI shielding structure, and thereby transfers the heat generated from the plurality of electronic circuit devices to the EMI shielding structure, wherein the thermal pad is compressed to fill a space defined between the EMI shielding structure and the plurality of electronic circuit devices, and wherein a compression set of the thermal pad is 70% or more.

2. The assembly of claim 1, wherein at least one of the plurality of electronic circuit devices has a height different from other electronic circuit devices; and wherein the thermal pad is a single sheet.

3. The assembly of claim 2, wherein the compression set of the thermal pad is 95% or more.

4. The assembly of claim 1, wherein the EMI shielding structure is an EMI shielding tape.

5. The assembly of claim 1, wherein the thermal pad includes a polymer matrix and a filler,
   wherein the polymer matrix includes at least one of a silicone elastomer and an acrylic polymer, and the filler includes at least one of aluminum oxide, aluminum hydroxide, aluminum nitride, and boron nitride, and is an electrical insulator.

6. An electronic device comprising the electronic circuit board assembly according to claim 1.

7. The device of claim 6, wherein the electronic device is a smart phone, a smart pad, or a portable computer.

\* \* \* \* \*

UNITED STATES PATENT AND TRADEMARK OFFICE
CERTIFICATE OF CORRECTION

PATENT NO. : 10,104,763 B2  
APPLICATION NO. : 15/328535  
DATED : October 16, 2018  
INVENTOR(S) : Lee et al.

Page 1 of 1

It is certified that error appears in the above-identified patent and that said Letters Patent is hereby corrected as shown below:

In the Specification

<u>Column 3</u>
Line 26, Delete "anelectronic" and insert -- an electronic --, therefor.

Signed and Sealed this  
First Day of October, 2019

Andrei Iancu  
*Director of the United States Patent and Trademark Office*